(12) United States Patent
Andle

(10) Patent No.: US 7,205,832 B2
(45) Date of Patent: *Apr. 17, 2007

(54) TEMPERATURE COMPENSATED, HIGH EFFICIENCY, CONTROLLED INPUT IMPEDANCE DIODE DETECTOR

(75) Inventor: Jeffrey C. Andle, Westbrook, ME (US)

(73) Assignee: Dover Electronics, Inc., Nashua, NH (US)

( * ) Notice: Subject to any disclaimer, the term of this patent is extended or adjusted under 35 U.S.C. 154(b) by 294 days.

This patent is subject to a terminal disclaimer.

(21) Appl. No.: 10/958,896

(22) Filed: Oct. 5, 2004

(65) Prior Publication Data

US 2005/0057302 A1 Mar. 17, 2005

Related U.S. Application Data

(63) Continuation-in-part of application No. 10/429,151, filed on May 2, 2003, now Pat. No. 6,825,715.

(51) Int. Cl.
*H03G 3/20* (2006.01)
(52) U.S. Cl. ............. 329/370; 329/366; 327/332
(58) Field of Classification Search ........... 329/370, 329/366; 327/332; 330/140, 143, 289; 455/126; 434/185

See application file for complete search history.

(56) References Cited

U.S. PATENT DOCUMENTS

| 4,000,472 | A | 12/1976 | Eastland et al. |
|---|---|---|---|
| 4,490,681 | A | 12/1984 | Turner |
| 4,502,015 | A | 2/1985 | Nicholas et al. |
| 4,708,657 | A * | 11/1987 | Beller et al. ............ 434/185 |
| 4,791,380 | A | 12/1988 | Chiappetta |
| 4,820,995 | A | 4/1989 | Tamura |
| 5,060,298 | A | 10/1991 | Waugh et al. |
| 5,987,312 | A | 11/1999 | Dekker |
| 6,084,920 | A | 7/2000 | Ferdinandsen |
| 6,262,630 | B1 | 7/2001 | Eriksson |

OTHER PUBLICATIONS

"A Suppressed Harmonic Power Detector for Dual Band Phones", Alan Rixon and Raymond Waugh, Applied Microwave & Wireless, Nov. 1999, pp. 62-68 (Noble Press).
"Schottky Diode Voltage Doubler, Application Note 956-4" Hewlett Packard Co., Palo Alto CA, 1995.
U.S. Appl. No. 10/429,151, Jeffrey Andle, Not yet published.

* cited by examiner

*Primary Examiner*—Michael B Shingleton
(74) *Attorney, Agent, or Firm*—Shalom Wertsberger; Saltamar Innovations

(57) ABSTRACT

A diode detector comprising a detector network adapted to detect and multiply the detected voltage coupled to a divider network that comprise diodes in equal number to the number of diodes in the detector network, provides a passive detector applicable to any application requiring a small, efficient, high output, inexpensive temperature compensated detector for use as demodulator or as power to voltage converter. Integrating a portion of the divider network in the detector/multiplier network allows control over the minimum input impedance of the detector.

19 Claims, 5 Drawing Sheets

US 7,205,832 B2

TEMPERATURE COMPENSATED, HIGH EFFICIENCY, CONTROLLED INPUT IMPEDANCE DIODE DETECTOR

RELATED APPLICATIONS

This application is a continuation in parts of U.S. patent application Ser. No. 10/429,151 filed May 2nd 2003 presently U.S. Pat. No. 6,825,715, the application is hereby incorporated by reference in its entirety.

FIELD OF THE INVENTION

This invention relates to diode detector circuits and more particularly to a passive, temperature compensated high efficiency diode detector

BACKGROUND OF THE INVENTION

Diode detectors had been known in the art from the first days of radio. They are used to demodulate radio frequency (RF) or any other alternating current (AC) signal and turn it into voltage representative of the modulating waveform. A common diode detector is shown in FIG. 1. AC, sonic, sub sonic, ultra sonic or RF energy and the like (commonly referred to as RF hereinafter) is rectified by diode D1 that acts as a non-linear element for the conversion. While a Schottky diode is preferred, alternative asymmetric junctions are also suitable. The rectified signal is integrated by the capacitor C1 which also serves as the ground return path for the RF signal.

Additional components are frequently included to improve functionality. By way of example, inductor L1 may be employed to provide electrical matching. Resistor R1 and capacitor C2 offer a low pass filter for additional integration time and improved signal to noise ratio. Capacitor C3 is frequently employed to decouple the incoming RF from DC voltages in the circuit.

Those skilled in the art have long recognized that the diode detector may be used to generate voltage that is representative of the AC power inserted into the detector circuit. A typical diode detector circuit as shown in FIG. 1 has a wide frequency response, and a reasonably low conversion loss in the order of six or seven dB.

The circuit however, suffers from poor thermal stability. Several solutions are known in the art to improve stability over a wide temperature range, and are based generally on placing a pair of matching diodes in a the same ambient environment, exposing only one to the RF signal (a detector diode), and utilizing the other (a compensation diode) to cancel or minimize the effects of temperature on the first. An example of such circuit may be seen in FIG. 2, which utilizes a differential amplifier to reduce effects of the thermal characteristics of the diodes. Differential amplifier 25 amplifies the difference between the signal induced in each of the diodes and thus compensate for temperature drift. While the circuit of FIG. 2 offers temperature compensation, the cost, size, weight, and power requirements of the differential amplifier are prohibitive for many applications. The need for positive 24 and negative 22 power supplies further complicates circuit design, and is in stark contrast to the passive nature of the circuit of FIG. 1. Furthermore, the differential amplifiers typically have restricted operating temperature range, whereas the passive components operate over much larger temperature extremes. Thus there are distinct advantages for a detector circuit that does not require a differential amplifier.

Another example of a temperature compensated envelope detector is found in U.S. Pat. No. 4,000,472 to Eastland et al. Eastland teaches a voltage doubler envelope detector, with a forward bias applied to the detector input to shift detector operation out of the nonlinear square law region of operation. The temperature compensation is achieved by having a signal path extending through the envelope detector to one input of a differential amplifier, and having a similar reference path using similar diodes extending to the other input of the same differential amplifier. The difference voltage between the two paths is relatively less affected by temperature variations.

In U.S. Pat. No. 4,820,995 Tamura teaches an envelope detector comprising of passive elements. Essentially, the Tamura system provides a voltage divider, with a series leg having one diode, and an equivalent or similar parallel leg having a second diode. The detector output is from the junction between the legs. As similar DC current flows through both diodes, they exhibit very similar dynamic resistance, and thus one diode compensates for the temperature variability of the other, and the detector has good temperature stability. However, the Tamura circuit suffers a major drawback: Due to the voltage divider, the circuit provides only one half of the voltage provided by a single diode, non-compensated detector. This reduces the signal to noise ratio of the detector by about 6 dB.

In U.S. Pat. No. 6,262,630, Eriksson describes another temperature compensated diode detector. Eriksson provides for a detector diode and a compensation diode in series, and connects an output buffer at the output of the detector diode. As the Eriksson system is also based on a voltage divider, it suffers from a 50% (6 dB) decrease in detection efficiency over the single diode detector, which like the Tamura circuit translates into lower dynamic range and lower signal to noise ratio.

In "A Suppressed Harmonic Power Detector for Dual Band Phones", (Alan Rixon and Raymond Waugh, APPLIED MICROWAVE & WIRELESS, November 1999, pp. 62–68 (Noble Press)) Rixon et al provide another temperature compensated detector, as seen in FIG. 3. The circuit is designed towards suppressing the second harmonic of the detected signal. When measured with a differential amplifier the Waugh circuit provides good temperature stability but again suffers from the disadvantages of low efficiency and the use of a differential amplifier entails all the liabilities mentioned above.

Voltage multipliers are well known in the art. One may envision the voltage multiplier as a network in which by an arrangement of diodes a plurality of capacitors are connected in parallel to be charged, and connected in series to be discharged, thus effectively doubling the input voltage.

The invention described in U.S. patent application Ser. No. 10/429,151 already incorporated by reference supra, described a temperature compensated diode detector comprising a detector network and a divider network, each having an equal number of diodes therein. The detector network is operative to detect a voltage commensurating with an input signal and to multiply detected voltage by a predetermined factor. The divider network is coupled to the multiplied voltage and is operative to reduce said multiplied voltage. However, at relatively high signal input levels the input resistance at RF becomes a significant and variable load to the RF circuit.

The numerous attempts described above as well as many others point to a clear, and heretofore unfulfilled need in the industry for a high efficiency, temperature stable, envelope detector. The present invention aims to provide such a detector.

SUMMARY OF THE INVENTION

It is therefore an aim of the present invention to improve on the detector disclosed in U.S. Ser. No. 10/429,151, by allowing control of the minimum input impedance while maintaining advantages held by the previous invention. This is achieve by distributing portions of the divider network within the detector network.

Thus, in one aspect of the present invention, there is provided a temperature compensated diode detector comprising an input terminal adapted to receive an input signal, and an output terminal for outputting a detected voltage commensurating with the input signal. The input signal is coupled to a detector network comprising a detector diode, coupled to the input signal for producing a detected voltage. An integrating reactance is coupled to the detector diode. A voltage multiplier circuit comprising at least one multiplier diode, is coupled to the detected voltage for producing multiplied voltage. a divider network comprising at least first resistive element and a second resistive element, and a plurality of diodes equaling in number to the number of diodes in the detector network, and coupled to the multiplier so as to divide the multiplied voltage by a pre-determined divider factor. In order to provide controlled input impedance, the first resistive element is integrated within the detector network so as to affect a minimum input impedance to a signal inputted via said input terminal.

Preferably, the first resistive element comprises a plurality of resistors, distributed in said detector network. More preferably, at least one of said plurality of resistors is connected in the path between the input signal and the ground, and at least one of said plurality of resistors is connected in the path between the input signal and the integrating reactance. Preferably the resistors are of equal value, and most preferably the resistance of the first resistive element equals the resistance of the second resistive element. Also preferably, the plurality of resistors have equal thermal coefficient values.

Furthermore, the detector network may be comprised of additional diodes, wherein the first resistive element is distributed between said diodes.

In the preferred embodiment of the invention, the detector network and the divider network are integrated within a single integrated circuit.

In a preferred embodiment, the detector network comprises a multiplier diode having a circuit ground coupled cathode. The detector diode cathode is coupled to the anode of said multiplier diode. An integrating capacitor is coupled between the anode of the detector diode and circuit ground. An injecting capacitor, also acting as a part of the voltage multiplier, couples the AC input signal to the cathode of said detecting diode. A plurality of multiplier and detector diode pairs may be placed in series creating an m-diode detector with a conversion efficiency m-fold higher than that of a single diode. The multiplier produces multiplied voltage with relation to the input signal. The divider network comprises of similar number of series connected diodes (m) to the number of series connected diodes in the detector network, and a first and second resistive elements. The first resistive element is integrated, in whole or in part, within the detector network, preferably as m separate resistors, each placed in the path between the input terminal and the circuit ground in series with one of the m detecting and multiplying diodes, either directly to circuit ground or via a capacitor. In the most preferred embodiment, these m resistors have equal resistance and the equivalent sum of resistances comprising the first resistive element equals the resistance of the second resistive element. As such the divider network provides an equal dynamic impedance component, and acts as a voltage divider to divide the voltage multiplier output by a factor of 2 or an approximate thereof, regardless of the temperature dependence of the equivalent resistance of the diodes. The combined circuit has an approximate conversion efficiency of m/2 and is temperature compensated. Most preferably, all diodes in the detector network and the divider network form a single series circuit branch with all diodes having the same polarity within the branch. It should be noted that the polarity of the diodes as described and shown is given by way of example only. Those skilled in the art will recognize that the circuit will operate in a similar fashion if all the polarities described above are reversed, and thus a similar circuit with inverted diode polarities is equivalent to the circuit shown, and that claims to one circuit extend to the opposite polarity circuit.

The invention is usable in many applications including when embedded within any integrated circuit, for bolometers, as demodulators in radio devices, and most specifically in digital radio or in Automatic Gain Control (AGC) or Automatic Level Control (ALC) circuits that are specially sensitive when used for Quadrature Amplitude Modulation (QAM). Uses also extend to spectrum analyzer and similar instrumentation. A significant advantage of the invention is the ability to place a passive, sensitive, temperature compensated detector in a harsh environment at the terminal end of a cable while obtaining sufficient signal integrity at the active electronic processing circuitry, located remotely from the harsh environment. This capability addresses not only passive detection of RF signals, but also power level and insertion loss measurements in sensors based on the propagation of RF, sonic, subsonic or ultrasonic signals in piezoelectric devices and other ultrasonic sensor devices.

BRIEF DESCRIPTION OF THE DRAWINGS

The invention will be better understood in view of the accompanying drawings in which.

DETAILED DESCRIPTION

Figure 1:
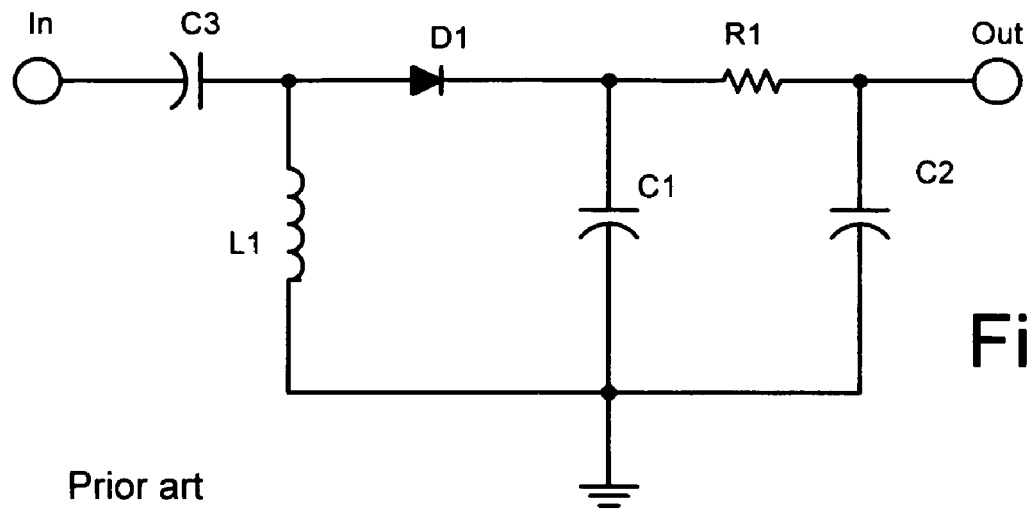
FIG. 1 depicts a prior art basic diode detector as known.
Figure 2:
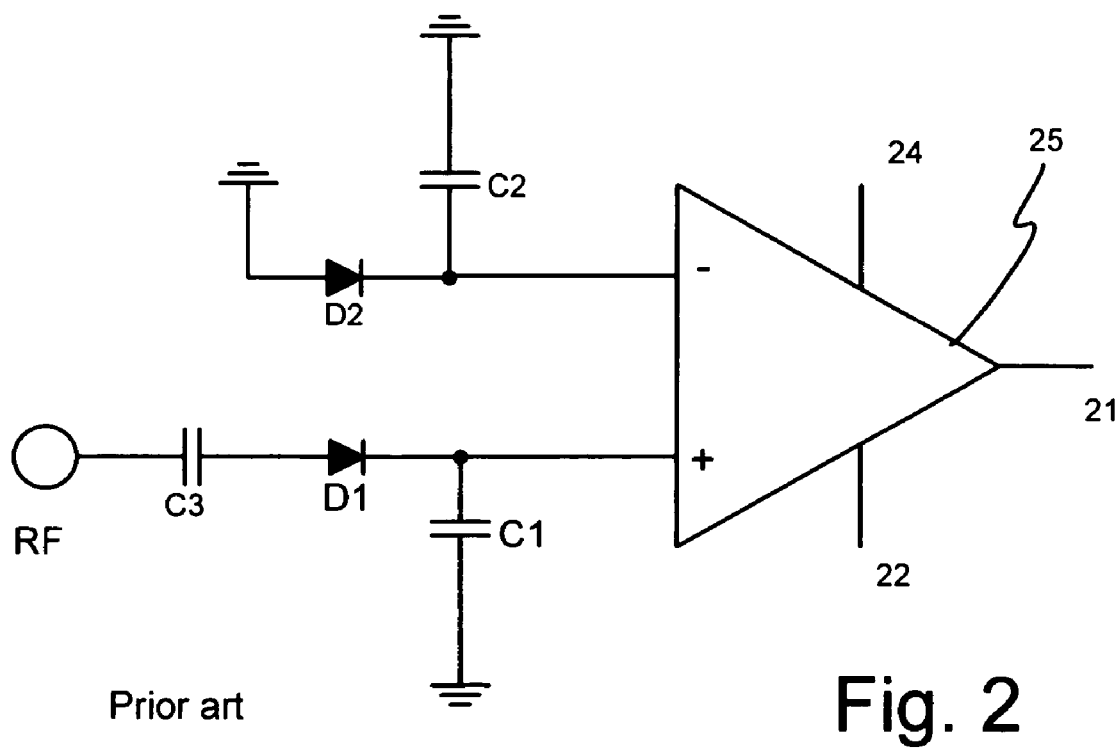
FIG. 2 depicts a prior art temperature compensated diode detector which relies on a differential amplifier for its operation.
Figure 3:
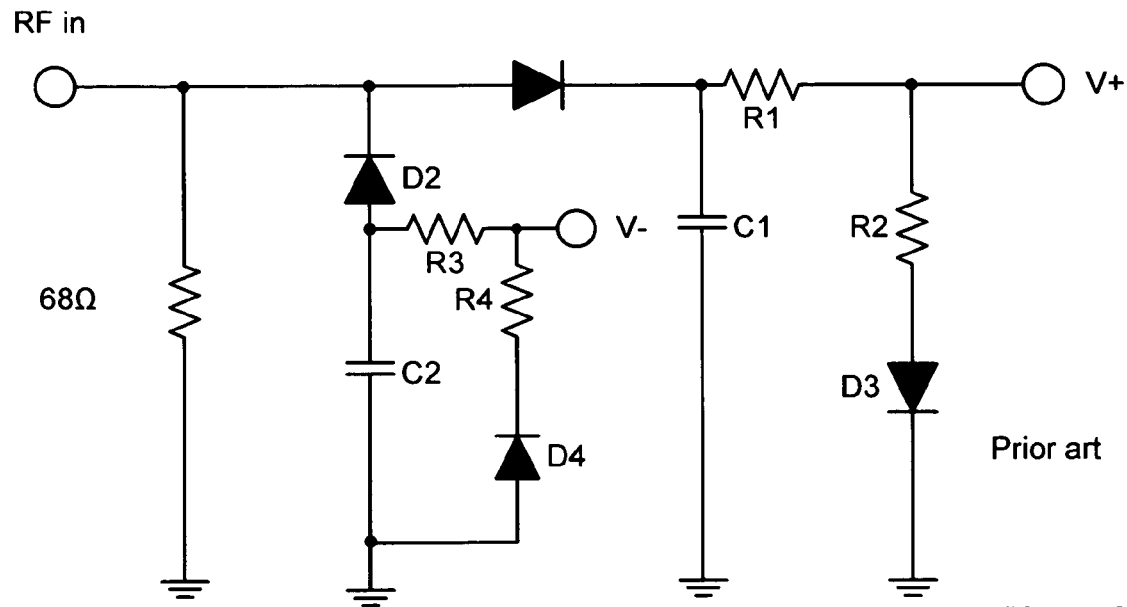
FIG. 3 depicts a prior art temperature compensated, differential diode detector circuit, adapted to suppress second harmonic detection, and to produce a differential output.
Figure 4:
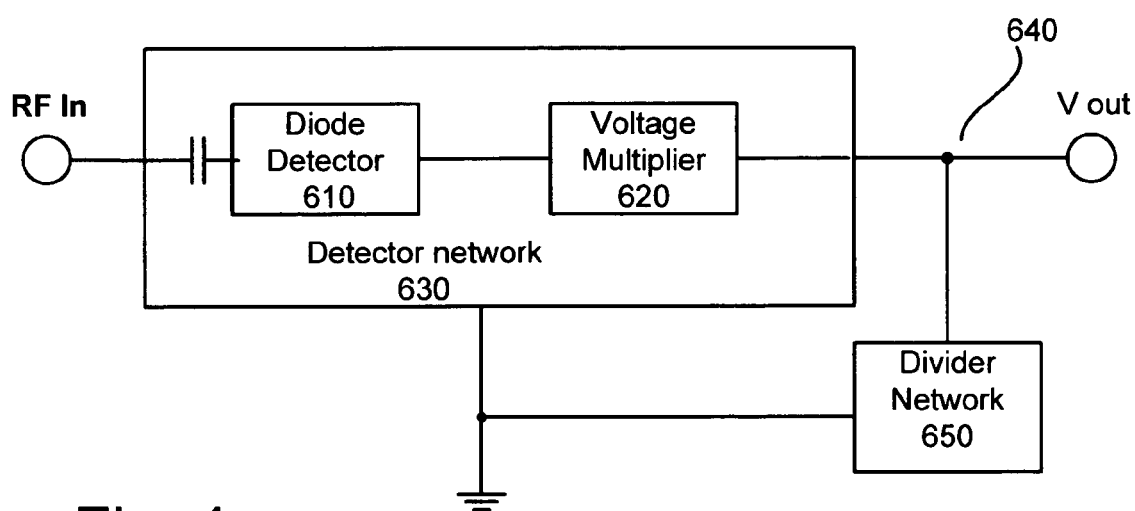
FIG. 4 depicts a simplified block diagram of a detector as disclosed in U.S. application Ser. No. 10/429,151

Referring now to FIG. 4 a most basic embodiment of the invention disclosed in Ser. No. 10/429,151 is shown. An RF (or any frequency) signal is inputted via input terminal RFin, into detector network 630. Detector network 630 comprises at least two basic components—a diode detector 610 and a voltage multiplier 620. Those skilled in the art will recognize that the diode used in the diode detector 610 may be utilized as a part of the voltage multiplier 620, or the detector may be separate from the voltage multiplier. In the preferred embodiment the voltage multiplier is a voltage doubler, comprising of the detector diode and a multiplier diode, however any number of diodes may be used, to provide voltage multiplication of any factor.

Divider network 650 is coupled to the output of the detector network at junction 640, and as it is coupled to the circuit ground (equivalently referred to as ground in these specifications), it forms a voltage divider together with the detector network. The divider network contains the same number of diodes as used in the detector network. It can be seen that the same DC current passes through the divider and detector network, and that the divider network dynamic impedance, dictated primarily by the diodes, will equal the dynamic impedance of the detector network. As the detected signal is taken before the divider network, temperature compensation is achieved. Preferably, the voltage divider cuts the output voltage in (about) half, however as the detected voltage was doubled, the total output remains the same as that of a single diode. Higher order multipliers of order offer detection efficiency increases of m/2.

Figure 5:
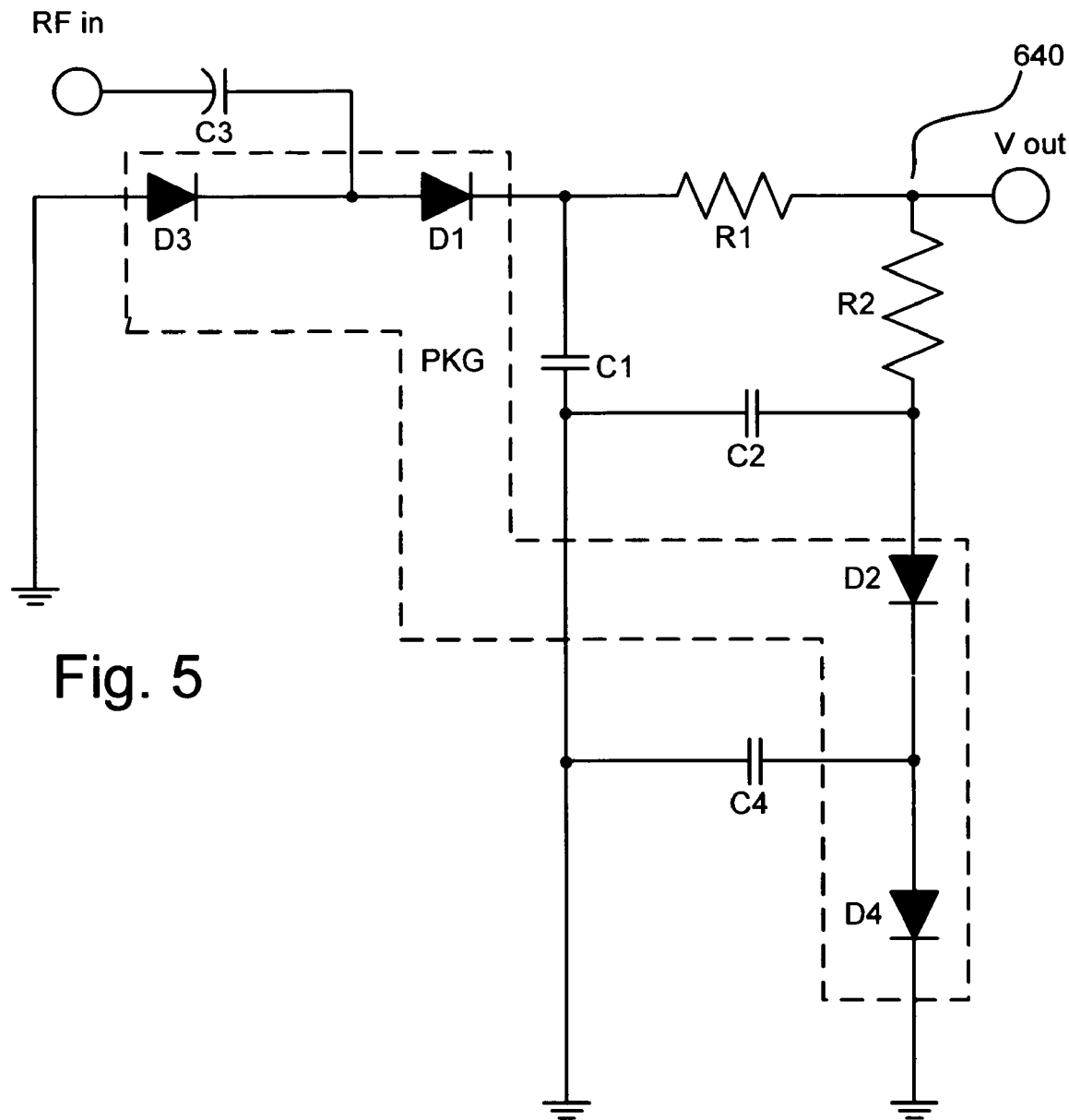
FIG. 5 depicts a basic diagram of a diode detector in accordance with the preferred embodiment of the Ser. No. 10/429,151 invention.

FIG. 5 shows a more detailed circuit example of the preferred embodiment of the Ser. No. 10/429,151 invention. However it can be appreciated that the RF input impedance of the circuit will be controlled primarily by the dynamic resistance Rd of the diodes. While the circuit operates well for low input signals, if the diodes are forward biased by sufficiently large input signal, the circuit acts as an amplitude limiter, and thus presents a variable and possibly significant load on the RF source. For a typical Schottky diode on silicon with a barrier height of 0.34 V, the circuit is an effective limiter at approximately 0 dBm (1 mW) incident RF power levels. For gallium arsenide diodes with a barrier height of 0.7V the circuit is an effective limiter at approximately 6 dBm (4 mW). Resistor R1 is a part of the voltage divider that provides the diodes for temperature compensation.

Figure 6:
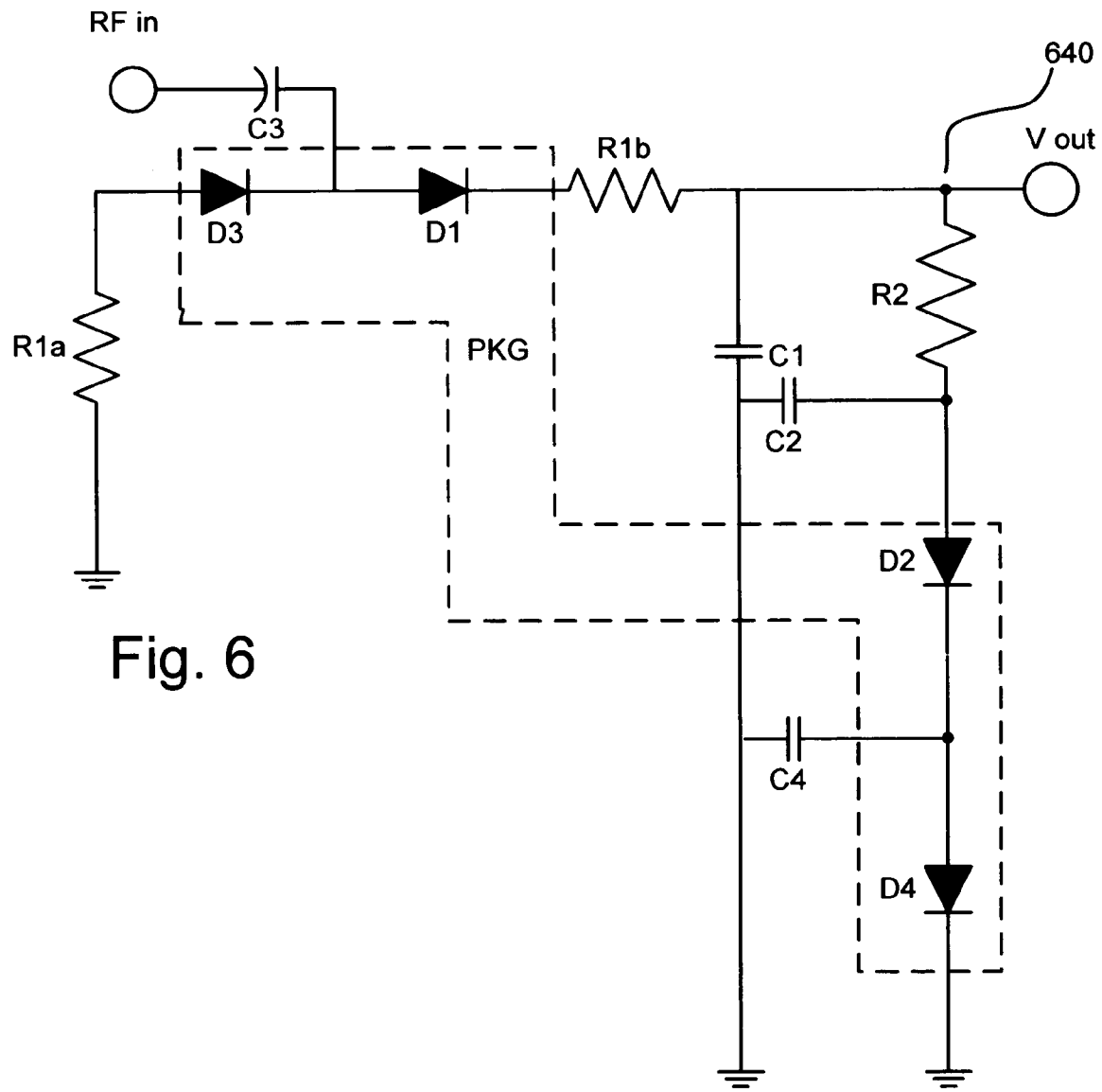
FIG. 6 represents a basic diagram depicting changes to FIG. 5 in accordance with the present invention.

I discovered that by placing the resistors R1a and R1b in the circuit as shown in FIG. 6, the input impedance of the circuit may be easily controlled. By setting the sum of resistance value of R1a and R1b to equal the resistance of R1 in FIG. 5, the DC equivalent characteristics of the circuit are maintained. Preferably, $$R_{1a} = R_{1b} = \frac{R1}{2} = \frac{R2}{2},$$

to maintain a balanced circuit, but any combination may be used if a balanced detector is not required or desired.

By placing at least a portion of the first resistive element (e.g. R1a) in the path of the input signal to ground and effectively, i.e. by any circuit equivalence, in series with at least one diode (e.g. D3), an impedance is placed on the signal to ground path. By placing another portion of the first resistive element (e.g. R1b) in the path of the input signal to the integrating reactance (e.g. C1), and effectively in series with another diode (e.g. D1), an impedance is placed on the signal to detector output path. If portions of the first resistive element are distributed in such way that each diode based path has at least some resistance over and above the dynamic resistance of the diode, the minimum input impedance may be controlled for desired input signal levels Other circuit modifications will also be apparent in light of the present disclosure, for example distributing only a portion of R1 into R1a and R1b, in which case the remaining resistance, R1'=R1−R1a−R1b, dividing the first resistive element to any number of resistors, and similar combinations that maintain the DC equivalence of the circuit, while controlling the input impedance. As known, the placement of the resistors and diodes may be modified to form equivalent circuits, which acts effectively in a similar manner, and such modifications should be considered equivalent to the present invention.

Preferably, the resistors thermal coefficients also match, to optimize the temperature compensation of the device. However it is noted that selecting diodes or resistors of differing values or thermal coefficients may be advantageous for achieving special functions. By way of example, such functions may include normalizing a sensor having a non-linear response curve, compensation of other stages in the circuit such as the response of a single stage transistor amplifier, and the like.

While large values of $R_{1a}$ and $R_{1b}$ are desired to minimize loading, the RF power is divided between the small signal level dynamic resistance of each diode and its corresponding series resistor. This introduces a variable divider in which at low powers the signal is primarily applied to the diode with a decreasing proportion of the power applied to the diode with increasing power level.

With the circuit as shown, the minimum input impedance is the equivalent value of R1a and R1b connected in parallel. While the input impedance will vary with the dynamic resistance of the diodes, the minimum input impedance may be set for large input signals, while maintaining the temperature stability and efficiency of the circuit. The circuit total efficiency will be minimally affected at small input signal levels, and while the circuit will be somewhat less efficient at high input signal levels, the detection linearity is improved.

It will be clear to the skilled in the art that the placement of the resistors as well as the number of resistors may vary. Thus by way of example, resistor R1a may be placed between capacitor C3 and diode D3, or a plurality of resistors may be used. However such embodiments should be considered equivalent to the one described above, as they provide at least some of the resistance of the divider arm into the input section of the multiplier arm.

Figure 7:
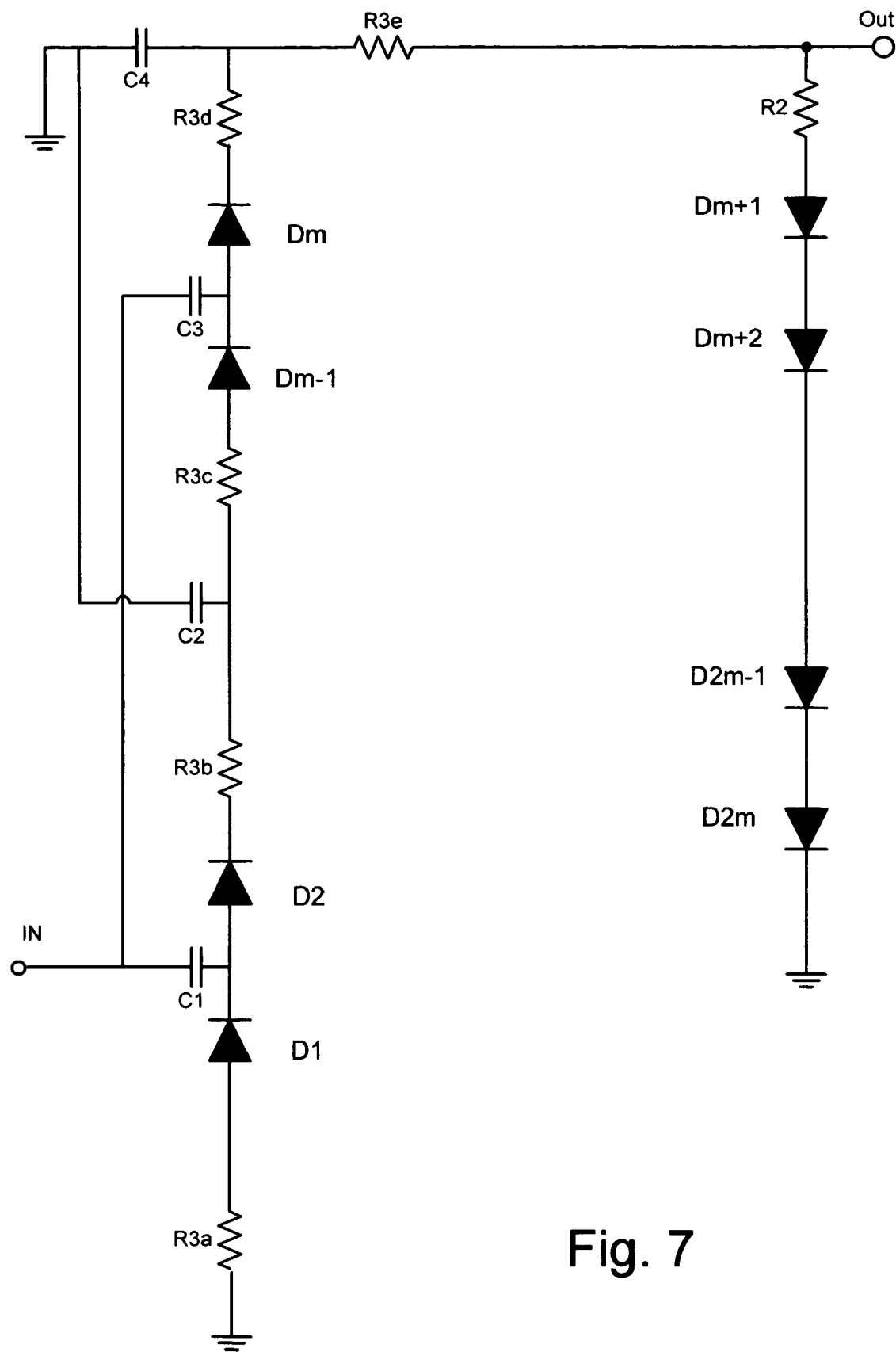
FIG. 7 depicts the general topology of an m-diode circuit (where m is even) having m/2 times the detection efficiency and input impedance limited by the value of the equivalent DC resistance of the resistors R3 in addition to the dynamic resistance of the diodes, while providing temperature compensation of the detected signal.

It is noted that while FIG. 6 deals with a two diode multiplier and a two diode divider, any number N of diode pairs may be employed, as can be seen in FIG. 7 for example (with detector arm diodes D1, D2, Dm and Dm−1, and divider arm diodes Dm+1, Dm+2, D2m−1 and D2M). FIG. 7 shows a circuit with N=2. The resistance of R1 in FIG. 5 is divided in the multiplier arm, preferably in a manner where the sum of resistances of R3a, R3b, R3c, R3d, and R3e, equal the resistance of R2. Further extension of the circuit to any number of diode pairs N is a matter well clear in the art, in light of the present invention.

It is also noted that the polarities shown and described may be reversed, and the circuit will operate in a similar manner.

Furthermore, each and every one of the diodes may be replaced by a plurality of diodes connected in series, with or without the distributed resistors, and thus providing an equivalent resistance, comprising primarily of the dynamic resistances of the diodes in series. The use of groups of diodes is functionally equivalent to using a single diode with a higher barrier voltage and should be considered an obvious extension of both Ser. No. 10/429,151 and the present invention.

The skilled artisan will recognize that other components, both active and passive, may be added as desired to improve certain characteristics of the circuit such as dynamic range, signal to noise, and the like without detracting from the invention. Some clear alterations include incorporating electrical matching networks, biasing circuitry, active buffer amplifiers, and the like.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

What is claimed is:

1. A temperature compensated diode detector comprising:
    an input terminal adapted to receive an input signal, and an output terminal for outputting a detected voltage commensurating with said input signal;
    a detector network comprising:
    a detector diode, coupled to said input signal for producing a detected voltage;
    an integrating reactance coupled to said detector diode;
    a voltage multiplier circuit comprising at least one multiplier diode, said voltage multiplier coupled to said detected voltage for producing multiplied voltage thereof; and,
    a divider network comprising at least first resistive element and a second resistive element, and a plurality of diodes equaling in number to the number of diodes in said detector network, and coupled to said multiplier so as to divide the multiplied voltage by a pre-determined divider factor;
    wherein said first resistive element is at least partially integrated within said detector network so as to affect a minimum input impedance to a signal inputted via said input terminal.

2. A temperature compensated diode detector as claimed in claim 1, wherein said first resistive element comprises a plurality of resistors, distributed in said detector network.

3. A temperature compensated diode detector as claimed in claim 2, wherein at least one of said plurality of resistors is connected in the path between the input signal and the ground, and effectively in series with at least one diode in said path.

4. A temperature compensated diode detector as claimed in claim 2, wherein at least one of said plurality of resistors is connected in the path between the input signal and said integrating reactance, and effectively in series with at least one diode in said path.

5. A temperature compensated diode detector as claimed in claim 2, wherein at least two of said plurality of resistors have equal resistance values.

6. A temperature compensated diode detector as claimed in claim 2, wherein said first resistive element has equal resistance value to said second resistive element.

7. A temperature compensated diode detector as claimed in claim 6, wherein at least two of said plurality of resistors have equal resistance values.

8. A temperature compensated diode detector as claimed in claim 1 wherein said detector network further comprises of additional diodes, and wherein at least a portion of said first resistive element is distributed between said diodes.

9. A temperature compensated diode detector as claimed in claim 2, wherein said plurality of resistors have equal thermal coefficient values.

10. A temperature compensated diode detector as claimed in claim 1, wherein said detector network comprises:
    a multiplier diode having a circuit ground coupled cathode, and an anode;
    a detector diode having a cathode coupled to the anode of said multiplier diode, and having an anode;
    said integrating reactance being an integrating capacitor coupled between said anode of the detector diode and to circuit ground; and,
    an injecting capacitor coupled to the cathode of said detecting diode, and coupling an AC signal thereto; and
    wherein said first resistive element comprises at least a first and a second resistors, said first resistor is connected effectively in series with said multiplier diode, and wherein said second resistor is coupled effectively in series with said detector diode.

11. A temperature compensated diode detector as claimed in claim 10, wherein said first resistive element and said second resistive element have an equal resistance value.

12. A temperature compensated diode detector as claimed in claim 11, wherein first resistor and said second resistor have equal resistance values.

13. A temperature compensated diode detector as claimed in claim 1, wherein said detecting network and said divider network are integrated within a single integrated circuit.

14. A temperature compensated diode detector as claimed in claim 1, wherein said detector network comprises:
    a multiplier diode having a circuit ground coupled anode, and a cathode;
    a detector diode having an anode coupled to the cathode of said multiplier diode, and having a cathode;
    said integrating capacitor being an integrating capacitor coupled between said cathode of the detector diode and to circuit ground; and,
    an injecting capacitor coupled to the anode of said detecting diode, and coupling an AC signal thereto;
    wherein said first resistive element comprises at least a first and a second resistors, said first resistor is connected effectively in series with said multiplier diode, and wherein said second resistor is coupled effectively in series with said detector diode.

15. A temperature compensated diode detector comprising a detector network and a divider network, each having an equal number of series coupled diodes therein;
    wherein the detector network is adapted to be coupled to an input signal and is operative to detect a voltage commensurating with said input signal and to multiply said detected voltage to produce a multiplied voltage;
    said divider network comprising a first and a second resistive elements, wherein at least a portion of said first resistive element is integrated within said detector network, so as to produce an impedance between a signal input to said detector network and circuit ground;
    wherein said divider network is operative to reduce said multiplied voltage in a temperature dependent manner.

16. A temperature compensated diode detector as claimed in claim 15 wherein said first and second resistive elements having an equal resistance value.

17. A temperature compensated diode detector as claimed in claim 15 wherein said first resistive element comprises at least a first and a second resistors, said first resistor is connected in the path between said input signal and circuit ground, and wherein said second resistor is coupled in the path between said input signal and an integrating reactance.

18. A temperature compensated diode detector as claimed in claim 17, wherein said first and second resistors have an equal resistance value.

19. A temperature compensated diode detector as claimed in claim 18, wherein said detector network and said divider network are embedded within a single integrated circuit.

\* \* \* \* \*